(12) United States Patent
Mugler, III et al.

(10) Patent No.: US 6,775,568 B2
(45) Date of Patent: Aug. 10, 2004

(54) EXCHANGE-BASED NMR IMAGING AND SPECTROSCOPY OF HYPERPOLARIZED XENON-129

(75) Inventors: John P. Mugler, III, Charlottesville, VA (US); Kai Ruppert, Santa Rosa, CA (US); James R. Brookeman, Charlottesville, VA (US)

(73) Assignee: University of Virginia Patent Foundation, Charlottesville, VA (US)

( * ) Notice: Subject to any disclaimer, the term of this patent is extended or adjusted under 35 U.S.C. 154(b) by 250 days.

(21) Appl. No.: 09/832,880

(22) Filed: Apr. 12, 2001

(65) Prior Publication Data

US 2001/0041834 A1 Nov. 15, 2001

Related U.S. Application Data

(60) Provisional application No. 60/196,673, filed on Apr. 12, 2000.

(51) Int. Cl.$^7$ .................................................. A61B 5/05
(52) U.S. Cl. ........................ 600/410; 600/420; 324/313; 424/9.3
(58) Field of Search .................................. 600/410, 420, 600/431; 424/9.3, 9.37; 324/300, 307, 304, 309, 313; 534/7; 436/173

(56) References Cited

U.S. PATENT DOCUMENTS

H1968 H * 6/2001 Bernstein .................... 600/410
6,241,966 B1 * 6/2001 Albert et al. ................. 424/9.3
6,426,058 B1 * 7/2002 Pines et al. ................... 424/9.3

OTHER PUBLICATIONS

Song, "NMR and MRI Using Laser–Polarized Xenon," Spectroscopy, vol. 14, pp. 726–733, Jul., 1999.*

* cited by examiner

Primary Examiner—Quang T. Van
(74) Attorney, Agent, or Firm—Robert J. Decker

(57) ABSTRACT

A method and an apparatus for using hyperpolarized xenon-129 and magnetic resonance imaging or spectroscopy as a probe to non-invasively and non-destructively characterize important properties of certain structures or materials with high spatial and temporal resolution, resulting in high-resolution magnetic resonance images wherein the associated signal intensities reflect a property of interest of at least one of the compartments. Hyperpolarized xenon-129 is introduced into two compartments between which xenon-129 can be exchanged, for example, into the blood vessels of mammal organs and the tissue of said organ or into compartments within inorganic objects. Due to chemical shift and applied magnetic field strength, the hyperpolarized xenon-129 introduced into the first compartment has a different resonant frequency from the hyperpolarized xenon-129 introduced into the second compartment.

19 Claims, 5 Drawing Sheets

EXCHANGE-BASED NMR IMAGING AND SPECTROSCOPY OF HYPERPOLARIZED XENON-129

This application claims priority from Provisional Application No. 60/196,673 filed on Apr. 12, 2000 and entitled "Exchange-based NMR Imaging And Spectroscopy of Hyperpolarized Xenon-129," the disclosure of which is hereby incorporated by reference in its entirety.

FIELD OF THE INVENTION

The present invention relates generally to nuclear magnetic resonance imaging, and more particularly to the use of hyperpolarized xenon-129 in magnetic resonance imaging and spectroscopy.

BACKGROUND OF THE INVENTION

Over the past twenty years, nuclear magnetic resonance imaging (MRI) has developed into an important modality for both clinical and basic-science imaging applications. Nonetheless, advancements continue at a rapid pace. A recent notable advance was the introduction of "hyperpolarized" noble gases as a new contrast agent for nuclear magnetic resonance (NMR), as described, for example, in Albert MS, Cates GD, Driehuys B, et al., Biological magnetic resonance imaging using laser-polarized $^{129}$Xe, Nature 1994, 370:199–201. Prior to the introduction of hyperpolarized noble gases, under typical experimental conditions the nuclear polarization for MRI (to which the signal level, or in more general terms, the image quality, is proportional) was at most on the order of $10^{-4}$, whereas polarizations approaching 100% are possible with hyperpolarized gases. Therefore, considering that many NMR applications are inherently limited by the available signal level, hyperpolarized gases present the possibility for a significant improvement of the affected applications, as well as the possibility for applications that were heretofore not feasible.

Of particular interest for hyperpolarized-gas NMR studies are the two nonradioactive noble-gas isotopes with a nuclear spin of ½, helium-3 and xenon-129. Both nuclei are useful for imaging of gas-filled spaces, such as cracks and voids in materials (see, e.g., Song Y Q, Gaede H C, Pietrass T, et al. Spin-polarized $^{129}$Xe gas imaging of materials. J Magn Reson 1995, A115:127–130), or the lungs and sinuses in humans and animals (see, e.g., Albert M S, Cates G D, Driehuys B, et al. Biological magnetic resonance imaging using laser-polarized $^{129}$Xe. Nature 1994, 370:199–201). Xenon-129 is soluble in a variety of substances, while helium-3 in general has a very low solubility (see, e.g., Abraham M H, Kamlet M J, Taft R W, Doherty R M, Weathersby P K. Solubility properties in polymers and biological media. 2. The correlation and prediction of the solubilities of nonelectrolytes in biological tissues and fluids, J Med Chemistry 1985, 28:865–870). In particular, xenon is lipophilic, having a high solubility in oils and lipid-containing tissues. Another important characteristic of xenon-129 is an exquisite sensitivity to its environment which results in an enormous range of chemical shifts upon solution (e.g., a range of approximately 200 ppm in common solvents) or adsorption (see, e.g., Miller K W, Reo N V, Uiterkamp A J M S, Stengle D P, Stengle T R, Williamson K L. Xenon NMR: chemical shifts of a general anesthetic in common solvents, proteins, and membranes, Proc Natl Acad Sci USA 1981, 78:4946–4949). These solubility and chemical shift characteristics make xenon-129 a valuable probe for a variety of material science and biological applications.

In the medical field, dissolved-phase NMR of hyperpolarized xenon may allow perfusion imaging of the brain, lung, and other organs (such as kidneys), and offers the potential for the non-invasive characterization of other important physiological parameters. Upon inhalation, xenon dissolves rapidly into the bloodstream and is transported throughout the body, with preferential distribution to lipid-rich regions. Nonetheless, despite some remarkable results from Swanson et al. (see Swanson S D, Rosen M S, Agranoff B W, Coulter K P, Welsh R C, Chupp T E. Brain MRI with laser-polarized $^{129}$Xe, Magn Reson Med 1997,38:695–698; see also Swanson S D, Rosen M S, Coulter K P, Welsh R C, Chupp T E. Distribution and dynamics of laser-polarized $^{129}$Xe magnetization in vivo. Magn Reson Med 1999, 42:1137–1145) that demonstrated dissolved-phase xenon images from the brain, lung and heart of a rat using chemical-shift imaging, high-resolution dissolved-phase imaging in humans has remained elusive. The only in-vivo dissolved-phase images that have been obtained so far required the animals to be ventilated with xenon for extended periods of time, a technique that would appear to be impractical for use in humans.

The reasons that dissolved-phase imaging of xenon in humans has not been more successful are numerous, not the least of which is the fact that only a relatively small fraction of the inhaled hyperpolarized xenon-129 is dissolved at any point in time, and therefore the magnetization available for dissolved-phase imaging is much less than that available for gas-phase imaging. Nonetheless, if high-resolution MRI of dissolved-phase xenon were to be possible, it seems likely that a new field would emerge, yielding information of physiological and medical relevance that currently cannot be obtained using existing MRI techniques or any other available in-vivo imaging modality.

SUMMARY OF THE INVENTION

This present invention consists of the methodology and apparatus for using the signal from hyperpolarized xenon-129 nuclei in one compartment, which resonate at a given frequency determined by their chemical shift and the strength of the applied magnetic field of the NMR or MRI system, to indirectly measure, using MR spectroscopy or imaging methods, characteristics, such as the concentration, of xenon-129 nuclei in one or more other compartments which resonate at a frequency or frequencies distinct from that of the first compartment and which exchange in some manner with the nuclei of the first compartment.

For example, the first compartment could be gas-phase hyperpolarized xenon in the lung air spaces and the other compartments could be dissolved-phase hyperpolarized xenon in the lung parenchyma and in the blood of the alveolar capillary bed. For this example, our invention provides the means, among other possibilities, to acquire high-resolution magnetic resonance images of the gas-phase xenon that reflect the concentration of the dissolved-phase xenon. With an appropriate choice of parameter values, the gas-phase images subsequently created indicate the volume of lung parenchyma, an important physiological parameter of medical relevance. In this example, using variations of the method, it may be possible to measure other meaningful physiological parameters such as the lung blood volume or the lung surface to volume ratio. In essence, the invention permits the strong xenon gas-phase signal to be used as an amplifier to measure, with high resolution, characteristics of the much weaker xenon dissolved-phase signal by taking advantage of the exchange that occurs between the gas and dissolved phases. This invention thus provides the means to measure, in a non-invasive and practical fashion, various properties of the lung that cannot be measured non-invasively at a competitive resolution by any other method.

Besides the lung, the invention also has obvious application to the study and characterization of certain materials wherein hyperpolarized xenon introduced into or surrounding the material exists in distinct, chemically-shifted environments that are in exchange.

BRIEF DESCRIPTION OF THE DRAWINGS

The accompanying drawings, which are incorporated into and form a part of the instant specification, illustrate several aspects and embodiments of the present invention and, together with the description herein, serve to explain the principles of the invention. The drawings are provided only for the purpose of illustrating preferred embodiments of the invention and are not to be construed as limiting the invention.

DETAILED DESCRIPTION OF THE INVENTION

Figure 1:
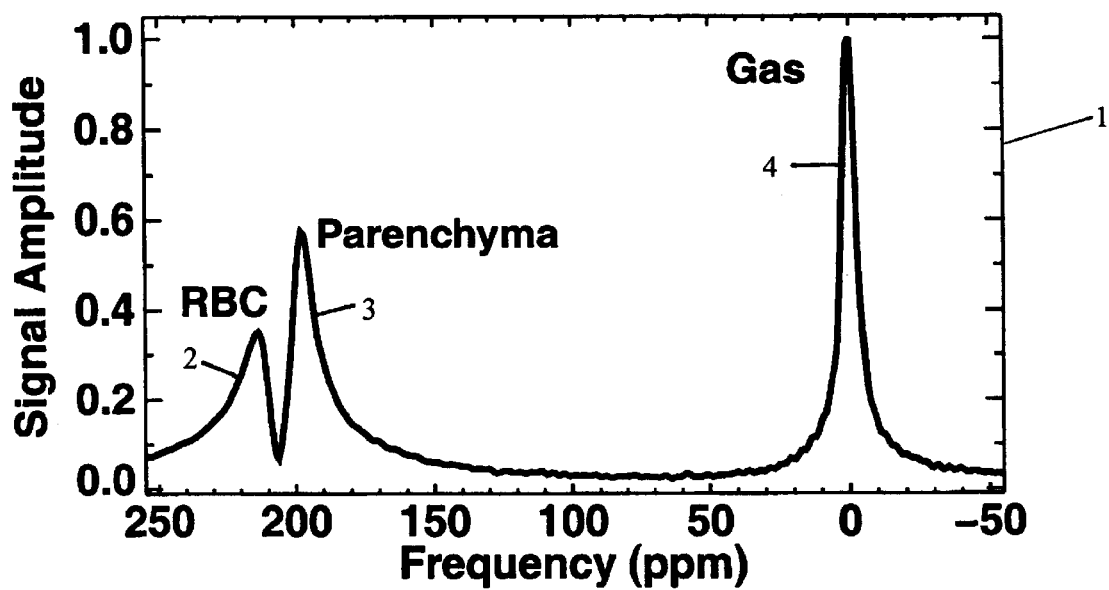
FIG. 1 shows a plot that depicts a representative hyperpolarized xenon-129 NMR spectrum from the chest of a canine, demonstrating the major resonances which can be detected.

This invention applies to the situation wherein there is a structure or material into or around which hyperpolarized xenon-129 can be introduced and wherein said xenon-129 exists in two or more chemically-shifted states that are in exchange, either directly or indirectly, within a time frame similar to or less than the characteristic NMR time constants for xenon in the given structure or material. For the present purposes, the "hyperpolarized" state is defined as a large (relative to the thermal equilibrium polarization for xenon-129 in the applied static magnetic field), non-equilibrium nuclear polarization created by any method, including but not limited to optical pumping and spin exchange (see, e.g., Walker T G, Happer W. Spin-exchange optical pumping of noble gas nuclei. Rev Mod Phys 1997, 69:629–642).

Given such a structure or material containing hyperpolarized xenon-129, placed in a suitable NMR or MRI system, the process of the present invention for using the signal from hyperpolarized xenon-129 nuclei in one compartment to indirectly measure characteristics, such as the concentration, of xenon-129 nuclei in one or more other compartments can be summarized as follows:

Using an appropriate magnetic resonance (hereinafter "MR") spectroscopy or imaging method, the signal from hyperpolarized xenon-129 in one compartment (hereinafter "the reference compartment") with a corresponding chemical shift, is measured. This step determines the initial condition for the experiment. This step can optionally be omitted, for example, if the initial condition is known or can be determined by other means, or if relative differences are of interest and thus knowledge of the initial condition is not needed. The xenon-129 magnetization in one or more other compartments (hereinafter "the target compartment(s)"), having chemical shift(s) distinct from that of the reference compartment, is perturbed using at least one radio-frequency (RF) pulse that is applied at a suitable frequency to affect predominantly the target compartment(s), followed optionally by additional RF pulses, time delays, and/or gradient pulses to further perturb the xenon-129 magnetization in the target compartments, in a desired fashion and to permit exchange of xenon-129 magnetization between the target and reference compartments. Using an appropriate MR spectroscopy or imaging method, the signal from hyperpolarized xenon-129 in the reference compartment is measured. The signal from the reference compartment now reflects the manipulations of the xenon-129 magnetization performed in the foregoing perturbing step, and the time constants, partition coefficients and geometrical factors characterizing the xenon exchange between the reference and target compartments. Specifically, the information that the measured signal reflects (for example, volume of material in which the xenon-129 dissolves) depends on the details of the NMR/MRI pulse sequence design. The signal from hyperpolarized xenon-129 in the reference compartment at this step may also reflect other independent processes such as T1 relaxation of xenon-129 in the reference compartment or unintended perturbation of the xenon-129 magnetization in the reference compartment by the manipulations of the foregoing perturbing step. In this case, a control experiment can be used wherein the effects of such independent processes are determined and thus these effects can be separated from those of exchange between compartments.

A specific implementation of this methodology is useful to illustrate the nature of the invention. For this purpose, the reference compartment is the lung air spaces of a canine containing gas-phase hyperpolarized xenon-129, and the target compartments consist of the lung parenchyma and the blood of the alveolar capillary bed containing dissolved-phase hyperpolarized xenon-129.

The experimental results described below were acquired using a 1.5T commercial whole-body imager (Magnetom Vision, Siemens Medical Systems, Iselin, N.J.). The hardware was modified by the addition of a broadband amplifier, permitting operation at the xenon-129 resonant frequency of 17.6 MHz. The RF coil was a modified commercial (Siemens) 1.5T sodium head coil (transmit/receive, linearly polarized). The coil was large enough to easily accommodate the chest of a medium-sized dog. The dog was anesthetized with pentothal 0.4 mg/kg IV and intubated before being placed in the xenon-129 RF coil in a supine position. Anesthesia was maintained by IV pentothal as needed. Hyperpolarized xenon-129 gas was generated using a prototype commercial system (Model 9600 Xe Polarizer, Nycomed Amersham Imaging, Inc., Durham, N.C.) that routinely achieves polarization levels of approximately 7% for 1 liter of gas in 1 hour. At the end of the polarization process xenon was dispensed into 600 cc plastic bags (Jensen Inert Products, Coral Springs, Fla.) and carried to the imager. Immediately before the beginning of the NMR or MRI measurements, the bag was connected to the intubation tube of the dog. During a period of normal inspiration the bag was manually deflated and the polarized xenon-129 was thereby released into the lungs. For the duration of the experiments, the intubation tube was clamped off to prevent a premature expiration.

For the experimental conditions described above, FIG. 1 shows a representative NMR spectrum from a canine chest 1. Three prominent spectral peaks 2, 3, 4 are observed, attributed to (from left to right) dissolved-phase xenon-129 in red blood cells and the lung parenchyma, and gas-phase xenon-129 in the lung air spaces. Note that this spectrum was acquired following a 900-us, Gaussian-shaped 90° RF pulse with a center frequency at approximately 200 ppm in FIG. 1. The flip angle at the gas-phase frequency (0 ppm in FIG. 1) was thus less than 1°, indicating that the gas-phase reservoir is substantially larger than the dissolved-phase reservoirs.

As a specific implementation of the process outlined above, the following experiment was performed immediately following the inhalation of 600 cc of hyperpolarized xenon-129 by the dog:

An MR image of the gas-phase xenon-129 from a 15-mm thick coronal section of the lung was acquired using a conventional low-flip-angle, gradient-echo pulse sequence (repetition time/echo time, 20/6.4 ms; flip angle, 5°; in-plane resolution, 4.7×4.7 mm$^2$). A series of 40 RF pulses (Gaussian-shaped, 900-us duration, flip angle 90°) was applied, with a time delay of 100 ms following each pulse. These RF pulses were centered at 202 ppm (see FIG. 1). The foregoing image acquisition was repeated at the same spatial position. The preceding three steps will be termed the "exchange experiment." For a "control experiment," the same three steps were repeated following a second inhalation of 600 cc of hyperpolarized xenon-129 by the dog, with the exception that the RF pulses were centered at −202 ppm (i.e., not on the dissolved-phase xenon-129 resonances).

Figure 2:
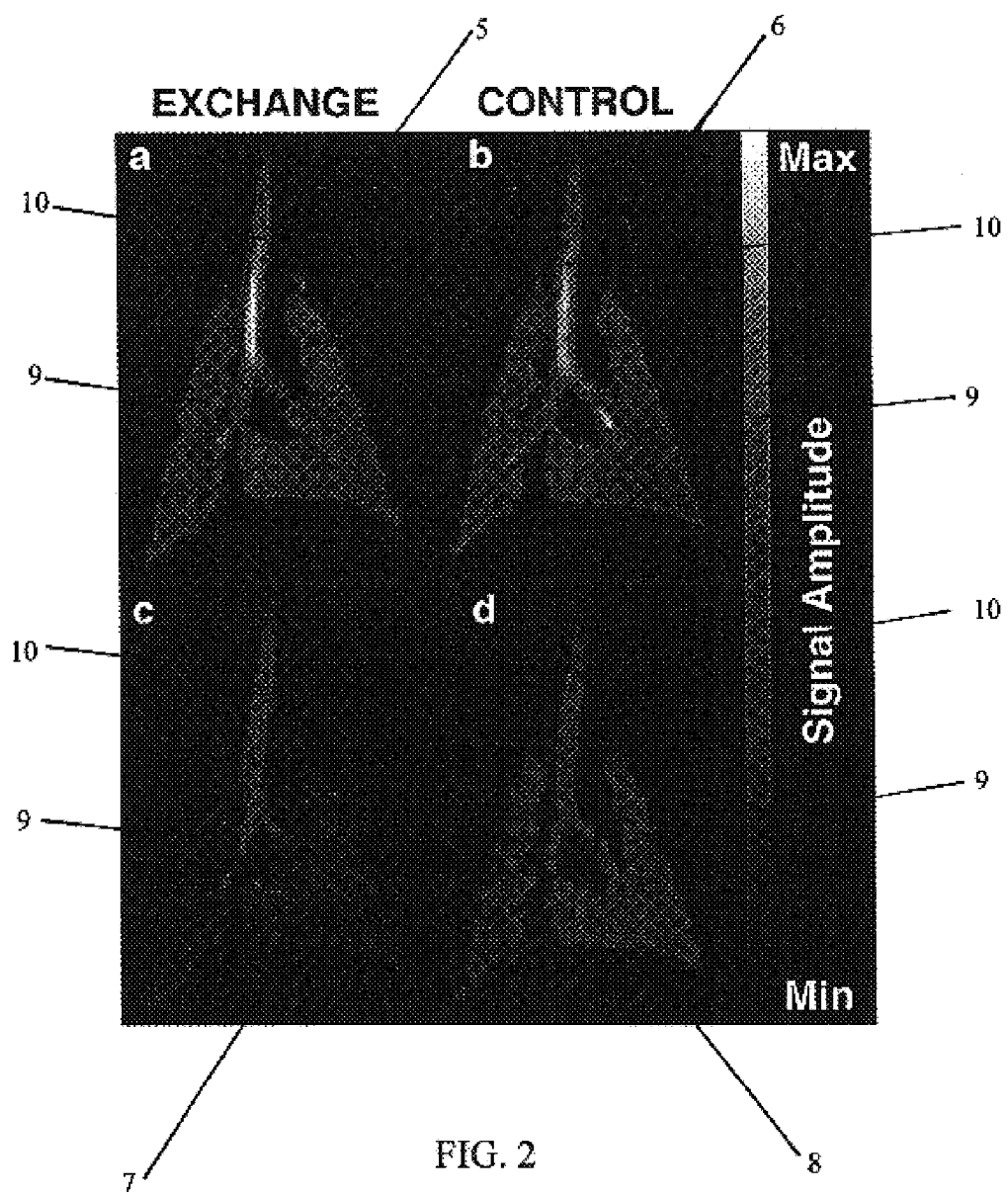
FIG. 2 shows four gradient-echo MR images, including two images referred to as "exchange" images which were acquired using a specific implementation of the methodology of the invention, and two "control" images which were obtained for comparison.

FIG. 2 shows four gas-phase xenon-129 lung images 5, 6, 7, 8 resulting from the process described in the previous paragraph. The lung images each show, inter alia, lung parenchyma 9 and major airways 10. Notice that aside from minor differences, the overall intensity distributions in image 5 (FIG. 2a, first imaging step in the exchange experiment) and image 6 (FIG. 2b, first imaging step in the control experiment) are very similar. Ideally, these two images would be identical, but minor differences are not unexpected since the images were collected during separate breath-hold periods. The situation changes considerably in the second set of images, shown in image 7 (FIG. 2c, second imaging step in the exchange experiment) and image 8 (FIG. 2d, second imaging step in the control experiment), acquired after the application of the RF pulses. The signal decrease in the lung parenchyma 9 is considerably higher in the exchange experiment than in the control experiment. At the same time, the signal in the major airways 10 remains relatively high in the exchange image.

Figure 3:
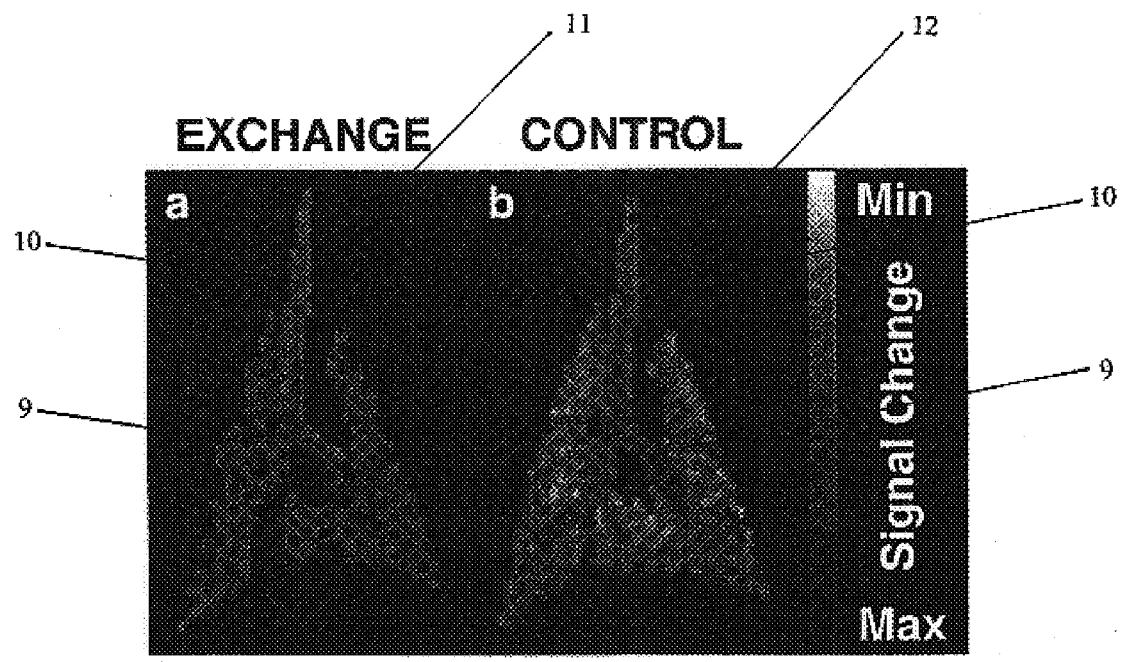
FIG. 3 shows two images which are the ratios of the signal intensities for the two "exchange" images and the two "control" images of FIG. 2, and provides an improved visualization of difference in signal changes that occur in the exchange case as compared to the control case.

These observations are further evident in FIG. 3, which shows in image 11 (FIG. 3a) the result of dividing the signal intensities from the second image 7 by those from the first image 5 from the exchange experiment, and in image 12 (FIG. 3b) the result of dividing the signal intensities from the second image 8 by those from the first image 6 from the control experiment. In these signal-ratio images 11, 12, regions with a low exchange between tissue and gas spaces appear bright and regions with high exchange are dark. The differences between the exchange experiment and control experiment images are clearly seen. While in the control experiment image the intensity distribution is relatively homogeneous, except for the central large airways 10, the intensity variation in the exchange experiment image is much more pronounced. In particular, the major airways 10, which are not expected to experience any significant gas-to-tissue exchange, clearly stand out.

Figure 4:
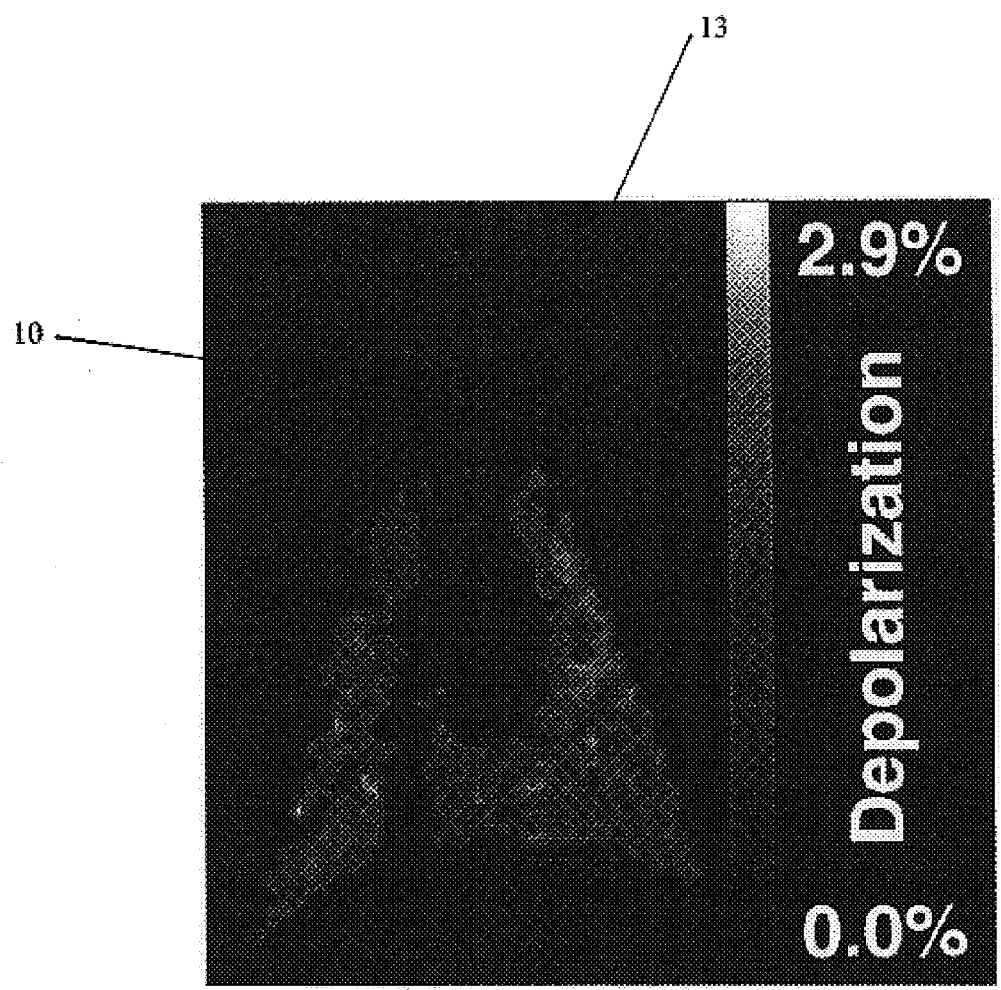
FIG. 4 shows one image, calculated from the two images of FIG. 3, that gives a quantitative indication of the degree of exchange which took place between the lung air spaces and parenchyma, information from which physiological parameters of medical relevance can be deduced.

In a final processing step, quantitative information was extracted from the imaging results by computing the depolarization per RF pulse (see, e.g., Ruppert K, Brookeman J R, Hagspiel K D, Mugler III J P. Probing lung physiology with xenon polarization transfer contrast (XTC). Magn Reson Med 2000, 44:349-357). The resulting depolarization map 13 is displayed in FIG. 4. As predicted, the polarization transfer between xenon-129 dissolved in tissue and xenon-129 gas in the trachea and the bronchi is so small that the major airways 10 appear almost black in the map. Overall, the depolarization ranged from approximately zero up to a maximum of 2.9% per RF pulse.

The time delay between RF pulses was chosen to be larger than the time required for practically all xenon atoms in the parenchyma to exchange with the gas phase (id.). For this condition, the depolarization per RF pulse is expected to be directly proportional to the ventilated lung-tissue volume. Other experimental configurations may yield different types of information. For instance, it might be possible to obtain information about the alveolar surface area by using very short time delays between RF pulses. At time delays of 10 ms or less, the xenon atoms do not have sufficient time to equilibrate across compartments before the magnetization in the lung parenchyma is again saturated by an RF pulse (id.). Thus, one would expect lung regions with larger surface-to-volume ratios to experience more depolarization of the gas phase than regions with smaller surface-to-volume ratios, and therefore to appear darker in an exchange image. Another possibility would be to selectively saturate one of the dissolved-phase components with the RF pulses, leading to preferential depolarization of this tissue compartment. Appropriately designed experiments might provide information on the structure of the lung tissue or tissue perfusion.

Figure 5:
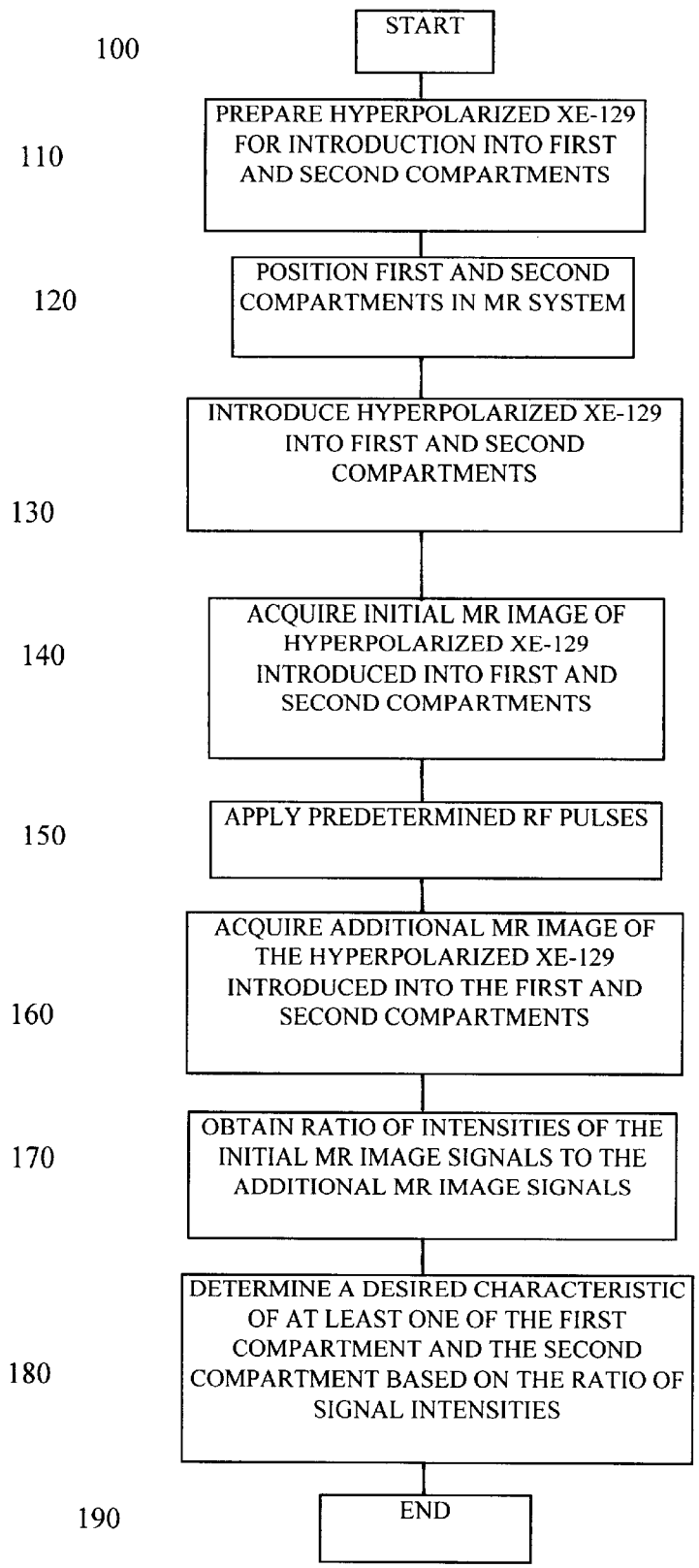
FIG. 5 shows a diagram identifying the steps of an exemplary embodiment of the process of the present invention.

FIG. 5 is a diagram describing the steps set forth in the foregoing exemplary embodiment. On starting the process (step 100), at step 110 the hyperpolarized xenon-129 is prepared for introduction into the first and second compartments (in the foregoing embodiment, by use of a commercial polarization device). At step 120, the first and second compartments are placed into the imaging portion of a MR system in preparation for MR imaging (in the foregoing embodiment, the lung portion of the dog was positioned in the imaging portion of the MR system). The hyperpolarized xenon-129 is introduced into the first and second compartments at step 130 (in the foregoing embodiment, by manual deflation of a bag containing hyperpolarized xenon-129 into the dog's intubation tube), and an initial MR image is immediately acquired at step 140. At step 150 predetermined RF pulses are applied to the xenon-129 in the first and second compartments, and then at step 160 at least one additional MR image is acquired by the MR system. At step 170, the ratio of the intensities of the initial MR image signals and the additional MR image signals are obtained (as described in FIG. 3 in the foregoing embodiment), whereupon at step 180 qualitative and quantitative assessments of particular characteristics of the first and second compartments can be made. The foregoing exemplary embodiment of the process ends at step 190.

It should be understood that while the process described in the foregoing exemplary embodiment was presented with a certain ordering of the steps, it is not our intent to in any way limit the present invention to a specific step order. It should be readily apparent to one of skill in the art that the various steps can be performed in different orders, for example, the step of positioning the first and second compartments in the MR system may occur prior to, or simultaneously with, the introduction of the hyperpolarized xenon-129 into the compartments. Further, we have described herein the novel features of the present invention, and it should be understood that we have not included details well known by those of skill in the art, such as methods of introducing hyperpolarized xenon-129 into the first and second compartments or the design and operation of a MR imaging system.

The present invention is directed to a method for using hyperpolarized xenon-129 as a probe to non-invasively and non-destructively characterize important properties of certain structures or materials with a combination of spatial and temporal resolution that is unmatched by current imaging modalities, resulting in high-resolution MR images wherein the associated signal intensities reflect a material property of interest. Those skilled in the art will readily appreciate that the foregoing embodiment wherein the process of determining characteristics of a lung was described is merely illustrative of a single application of the present invention, and that it is readily apparent that use of hyperpolarized xenon-129 in magnetic resonance imaging in the manner of the invention permits the determination of the exchange characteristics between any two compartments between which exchange of xenon-129 of differing resonant frequencies is permitted to occur, such as between the blood vessels of mammal organs and the tissue of said organ, or as between compartments within inorganic objects. Accordingly, the foregoing description of the exemplary embodiment is not to be construed as limiting the present invention to the specific embodiment disclosed, and it is to be understood that modifications to the disclosed embodiment, as well as other embodiments and their equivalents, are intended to be included within the scope of the claims attached hereto.

We claim:

1. A process of magnetic resonance imaging or spectroscopy, comprising the steps of:
    introducing a first form of hyperpolarized xenon-129 having a first resonant frequency into a first compartment;
    introducing a second form of hyperpolarized xenon-129 having a second resonant frequency which is different from said first resonant frequency into a second compartment, wherein said second compartment and said first compartment permit exchange of hyperpolarized xenon-129 therebetween;
    positioning said first compartment and said second compartment in an NMR system;
    measuring the magnetic resonance signal of said hyperpolarized xenon-129 introduced into said first compartment;
    allowing exchange of hyperpolarized xenon-129 between said first compartment and said second compartment;
    measuring the magnetic resonance signal from the hyperpolarized xenon-129 in said first compartment after exchange with said hyperpolarized xenon-129 introduced into said second compartment; and
    determining, by comparison of said magnetic resonance signal of the hyperpolarized xenon-129 in said first compartment and said magnetic resonance signal from the hyperpolarized xenon-129 in said first compartment after exchange with said hyperpolarized xenon-129 introduced into said second compartment, a parameter indicative of a characteristic of at least one of said first compartment and said second compartment.

2. The process of magnetic resonance imaging or spectroscopy of claim 1, further comprising the step of perturbing said hyperpolarized xenon-129 introduced into said second compartment.

3. The process of magnetic resonance imaging or spectroscopy of claim 2 wherein
    said perturbing step includes application of at least one of at least one radio-frequency pulse, at least one time delay, and at least one magnetic field gradient pulse.

4. The process of magnetic resonance imaging or spectroscopy of claim 1 or claim 3, wherein
    said hyperpolarized xenon-129 introduced into said first compartment is in one of a gaseous form and a dissolved form, and
    said hyperpolarized xenon-129 introduced into said second compartment is in a dissolved form.

5. The process of magnetic resonance imaging or spectroscopy of claim 4, wherein
    said first compartment and said second compartment are in direct contact with one another.

6. The process of magnetic resonance imaging or spectroscopy of claim 5, wherein
    said first compartment is an air space of a lung of a mammal, and
    said second compartment is at least one of parenchyma and a capillary bed of said lung.

7. The process of magnetic resonance imaging or spectroscopy of claim 5, wherein
    said first compartment is a space within blood vessels within an organ of a mammal, and
    said second compartment is a volume of said organ not including said space within the blood vessels of said organ.

8. The process of magnetic resonance imaging or spectroscopy of claim 7, wherein
    said organ is a brain of a mammal.

9. The process of magnetic resonance imaging or spectroscopy of claim 5, wherein
    said first compartment and said second compartment are within an inanimate object.

10. An apparatus for magnetic resonance imaging or spectroscopy using hyperpolarized xenon-129, comprising:
    a first compartment;
    a second compartment;
    a first form of hyperpolarized xenon-129 having a first resonant frequency for introduction into said first compartment;
    a second form of hyperpolarized xenon-129 having a second resonant frequency different from said first resonant frequency for introduction into said second compartment;
    a magnetic resonance system into which said first compartment and said second compartment are positioned,
    wherein said first compartment and said second compartment permit exchange of hyperpolarized xenon-129 therebetween, and
        wherein said magnetic resonance system measures a magnetic resonance signal of said hyperpolarized xenon-129 introduced into said first compartment prior to exchange of hyperpolarized xenon-129 between said first compartment and said second compartment, and a magnetic resonance signal from the hyperpolarized xenon-129 in said first compartment after exchange with said hyperpolarized xenon-129 introduced into said second compartment.

11. The apparatus for magnetic resonance imaging or spectroscopy using hyperpolarized xenon-129 of claim 10, further comprising:
   determining means for determining a parameter indicative of a characteristic of at least one of said first compartment and said second compartment, wherein said magnetic resonance signal of said hyperpolarized xenon-129 introduced into said first compartment and said magnetic resonance signal from the hyperpolarized xenon-129 in said first compartment after exchange with said hyperpolarized xenon-129 introduced into said second compartment are compared to determine said parameter.

12. The apparatus for magnetic resonance imaging or spectroscopy using hyperpolarized xenon-129 of claim 11, wherein said magnetic resonance system perturbs said hyperpolarized xenon-129 introduced into the second compartment.

13. The apparatus for magnetic resonance imaging or spectroscopy using hyperpolarized xenon-129 of claim 12, wherein said magnetic resonance system perturbs said hyperpolarized xenon-129 introduced into said second compartment with at least one of at least one radio-frequency pulse, at least one time delay, and at least one magnetic field gradient pulse.

14. The apparatus for magnetic resonance imaging or spectroscopy using hyperpolarized xenon-129 of claim 11 or claim 13, wherein
   said hyperpolarized xenon-129 introduced into said first compartment is in one of a gaseous form and a dissolved form, and
   said hyperpolarized xenon-129 introduced into said second compartment is in a dissolved form.

15. The apparatus for magnetic resonance imaging or spectroscopy using hyperpolarized xenon-129 of claim 14, wherein
   said first compartment and said second compartment are in direct contact with one another.

16. The apparatus for magnetic resonance imaging or spectroscopy using hyperpolarized xenon-129 of claim 15, wherein
   said first compartment is an air space of a lung of a mammal, and
   said second compartment is at least one of parenchyma and a capillary bed of said lung.

17. The apparatus for magnetic resonance imaging or spectroscopy using hyperpolarized xenon-129 of claim 15, wherein
   said first compartment is a space within blood vessels within an organ of a mammal, and
   said second compartment is a volume of said organ not including said space within the blood vessels of said organ.

18. The apparatus for magnetic resonance imaging or spectroscopy using hyperpolarized xenon-129 of claim 17, wherein
   said organ is a brain of a mammal.

19. The apparatus for magnetic resonance imaging or spectroscopy using hyperpolarized xenon-129 of claim 15, wherein
   said first compartment and said second compartment are within an inanimate object.

* * * * *